United States Patent
Hedler et al.

(10) Patent No.: US 8,598,716 B2
(45) Date of Patent: Dec. 3, 2013

(54) SEMICONDUCTOR APPARATUS HAVING STACKED SEMICONDUCTOR COMPONENTS

(75) Inventors: Harry Hedler, Germering (DE); Roland Irsigler, Munich (DE); Thorsten Meyer, Regensburg (DE)

(73) Assignee: Qimonda AG, Munich (DE)

( * ) Notice: Subject to any disclaimer, the term of this patent is extended or adjusted under 35 U.S.C. 154(b) by 1020 days.

(21) Appl. No.: 11/210,723

(22) Filed: Aug. 24, 2005

(65) Prior Publication Data

US 2006/0043561 A1    Mar. 2, 2006

(30) Foreign Application Priority Data

Aug. 30, 2004    (DE) .................. 10 2004 041 888

(51) Int. Cl.
*H01L 23/48* (2006.01)
(52) U.S. Cl.
USPC ................................ 257/777; 257/E25.013
(58) Field of Classification Search
USPC .......................................................... 257/777
See application file for complete search history.

(56) References Cited

U.S. PATENT DOCUMENTS

| | | | | |
|---|---|---|---|---|
| 4,764,804 A * | 8/1988 | Sahara et al. | .................. | 257/717 |
| 6,075,279 A * | 6/2000 | Andoh | .......................... | 257/620 |
| 6,310,392 B1 | 10/2001 | Burns | | |
| 6,589,813 B1 * | 7/2003 | Park | .............................. | 438/109 |
| 6,635,970 B2 * | 10/2003 | Lasky et al. | .................... | 257/777 |
| 2003/0178716 A1 | 9/2003 | Maeda et al. | | |

OTHER PUBLICATIONS

German Office Action dated Jun. 15, 2005.

* cited by examiner

*Primary Examiner* — Wensing Kuo
(74) *Attorney, Agent, or Firm* — Fay Kaplun & Marcin, LLP

(57) ABSTRACT

The present invention provides an apparatus having stacked semiconductor components. Two semiconductor components (21, 26) are arranged such that their contact regions (28, 22) are opposite one another. A contact-connection device (29) forms a short electrical connection between the two contact regions (28, 22). The contact regions (28, 22) are connected to external contact regions (36) of the apparatus via a rewiring (23).

3 Claims, 6 Drawing Sheets

PRIOR ART

PRIOR ART

SEMICONDUCTOR APPARATUS HAVING STACKED SEMICONDUCTOR COMPONENTS

TECHNICAL FIELD

The present invention relates to a semiconductor apparatus having stacked semiconductor components. The present invention also relates to a method for producing the semiconductor apparatus according to the invention.

BACKGROUND ART

Although the present invention is described with reference to memory components, the invention is not restricted thereto.

Memory components are connected to one another via a bus system, for example. The wiring paths provided, in particular of the signal lines, should be as short as possible. One technique provides for stacking memory components. The length of the wirings between contacts which are located above one another is kept short in this manner. FIG. 11 illustrates one known arrangement of housed semiconductor components 5. Two housed semiconductor components are placed on top of one another and are electrically connected to one another via the external wiring 3. FIG. 12 illustrates another arrangement for stacking. In this case, two unhoused semiconductor components 2 are placed on top of one another within a housing and are electrically connected by means of respective internal wiring 1 to the external wiring 3 of the housing. FIG. 13 illustrates another variant. In this case, two semiconductor components 2 are grouped around an intermediate layer 6 in the apparatus 8 and the individual semiconductor components are once again connected via internal wiring 1 to the external wiring 3 of the housing. FIG. 14 illustrates a fourth variant which differs from the previous arrangement by virtue of the fact that two semiconductor components 12 are stacked within a housing, an internal wire connection 1 and an interposer substrate forming the connection to the external supply lines, in the form of solder balls 16 in this case.

The impedance of the wirings between the contact regions 10 of the individual semiconductor components which are connected to one another is disadvantageously not matched in all four of the known semiconductor apparatuses presented. In particular, there is no provision for matching the impedance of the bonding wires having a typical length of the order of magnitude of 1 mm. Future memory generations having signal components in the frequency range of >1 GHz cannot be applied using these bonding wires.

Another problem results for bus systems having branches in the signal lines. In this case, it is not easily possible to match the impedance of all wiring sections without additional capacitances and inductances. Bus systems therefore always have sections with poor impedance matching.

This results in the problem of the performance of future memory components being restricted by signal reflections and interference effects on account of the wiring.

SUMMARY OF THE INVENTION

It is an object of the present invention to provide a semiconductor apparatus which makes it possible to stack semiconductor components and, at the same time, to provide improved wiring.

The above object is achieved by means of the apparatus mentioned in Claim 1. The apparatus is also produced using the method mentioned in Claim 6.

The essence of the invention is that two semiconductor components are arranged such that their active surfaces face one another. This results in it being possible to place the contact regions of the respective semiconductor components very close to one another. The fork in the electrical lines to the semiconductor contacts is thus situated in the immediate vicinity of the semiconductor contacts. The length of the wiring sections (which have not been matched) after the fork is therefore negligibly short.

According to the invention, the signal-carrying wirings are routed at a distance from an earth surface and are isolated from the latter by a dielectric layer. The cross section of the signal wiring, the distance between the signal wirings and the earth surfaces and the dielectric are selected in such a manner that the impedance is optimally matched for the typical frequencies of the semiconductor apparatus.

In accordance with one development of the apparatus according to the invention, the semiconductor components are embedded in a potting compound or a frame. The potting compound may contain a polymer.

In accordance with one development of the apparatus according to the invention, the contact-connection device has solder deposits and/or a conductive adhesive.

The method for producing the apparatus according to the invention achieves the object by virtue of the fact that a semiconductor component is embedded in a potting compound and a rewiring is applied and, in a subsequent step, a second semiconductor component is arranged opposite the first semiconductor component in such a manner that their contact regions are opposite one another and the previously applied rewiring is situated between the two semiconductor components. The two contact regions are connected to one another via a contact-connection device.

BRIEF DESCRIPTION OF THE DRAWINGS

Exemplary embodiments will be explained in detail below in conjunction with the figures, in which.

DETAILED DESCRIPTION OF THE INVENTION

Figure 1:
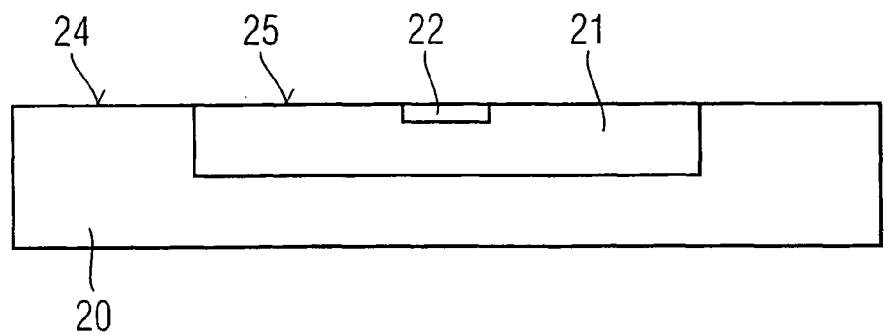
FIGS. 1-6 show diagrammatic illustrations of one embodiment of the production method.
Figure 2:
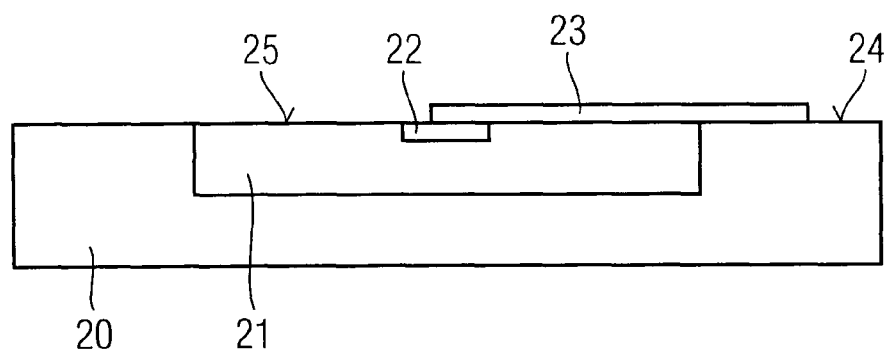
Figure 3:
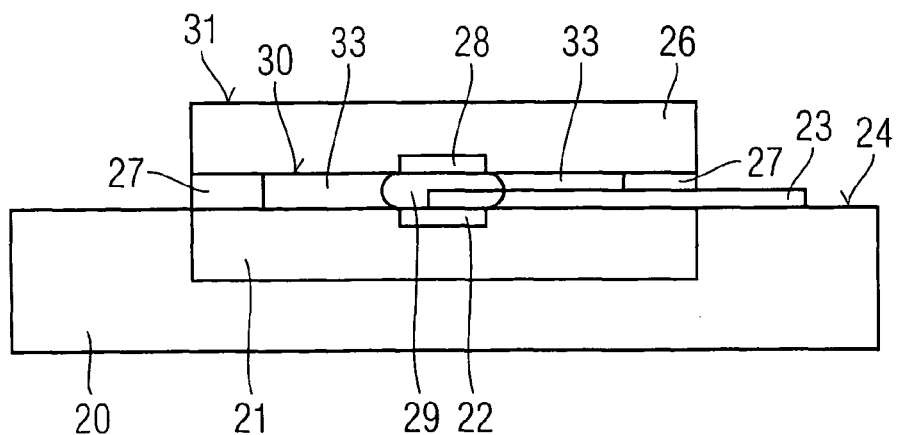
Figure 4:
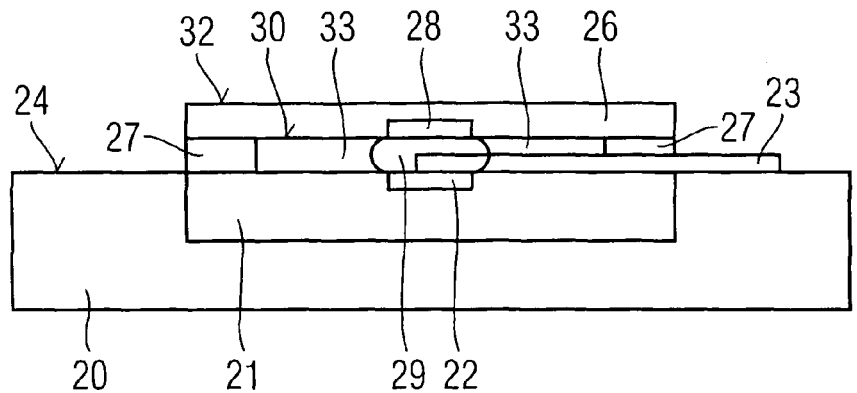
Figure 5:
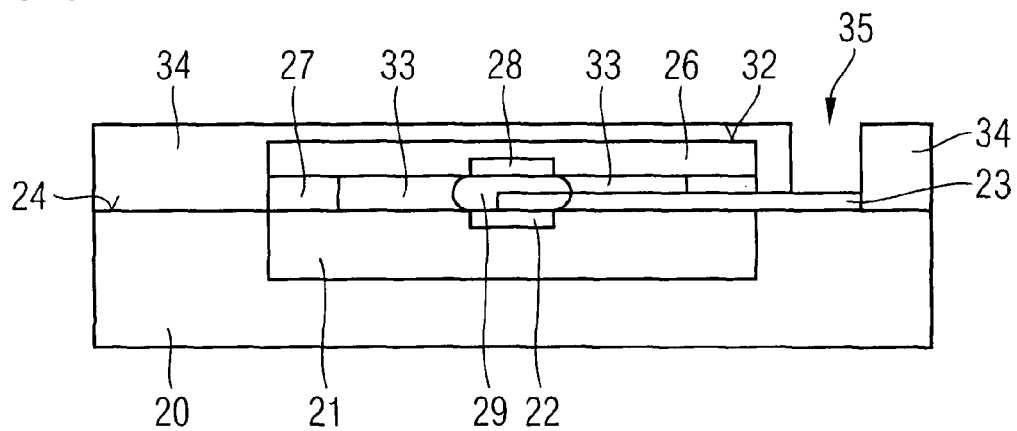

One embodiment of a production method of the present invention is explained in detail in FIGS. 1-6. Masking and etching techniques are not described in detail since it is assumed that these techniques are sufficiently well known.

In a first step (illustrated in FIG. 1), a first semiconductor component 21 is embedded in a potting compound or frame 20. This potting compound typically comprises a polymer. The first semiconductor component 21 has a contact region 22. This contact region is situated along a centre line on an active side 25 of the semiconductor component. This active side 25 is not covered by the potting compound 20. The active surface 25 advantageously forms a plane with an upper surface 24 of the potting compound 20. In a further step (illustrated in FIG. 2), a rewiring 23 is applied to the first semiconductor component and the potting compound. This rewiring 23 is in contact with the contact-connection region 22 of the first semiconductor component 21. In the case of a single-row contact arrangement, the rewiring 23 is typically effected along the contact region alternately on the left-hand and right-hand sides. In a subsequent step (illustrated in FIG. 3), an adhesive elevation 27 is applied in a partial region of the first semiconductor component and a contact-connection device 29 is applied to the individual contacts in the contact region 22. The contact-connection device 29 may have solder deposits and/or conductive adhesive.

A second semiconductor component 26 with its active surface 30 and the contact-connection region 28 situated therein is subsequently fastened on the adhesive elevations 27. In this case, the second semiconductor component is oriented in such a manner that its contact-connection region 28 is opposite the contact-connection region 22 of the first semiconductor component. The contact-connection regions 22 of the first semiconductor component are conductively connected to the contact-connection regions 28 of the second semiconductor component by the contact-connection region 28 being brought into contact with the contact-connection device 29 and a permanent connection being established by curing or remelting the contact-connection device 29. If necessary, a heat-treatment step is carried out in this case in order to liquefy the solder, for example. This results in the rewiring 23 being connected to the two semiconductor components 21, 26. The branch in the rewiring for the two semiconductor components 21, 26 is thus situated directly between the two contact-connection regions 22 and 28. A simple estimation that a signal transmission path which has not been matched has to be shorter than one tenth of the wavelength of the signal in the medium results in a limiting frequency of 200 GHz for this embodiment when the contact regions are at a distance of 100 μm from one another. This makes it possible to communicate very rapidly between the two semiconductor components which are connected via the contact-connection device. It is also ensured that the signal transmission paths from external contacts of the apparatus to the individual semiconductor components are almost of the same length, thus minimizing signal propagation differences.

In a subsequent step (illustrated in FIG. 4), the carrier substrate of the second semiconductor component can be ground. In this case, it is possible to achieve thicknesses of 50 μm. This is advantageous in order to achieve a low structural height of the semiconductor apparatus.

Figure 6:
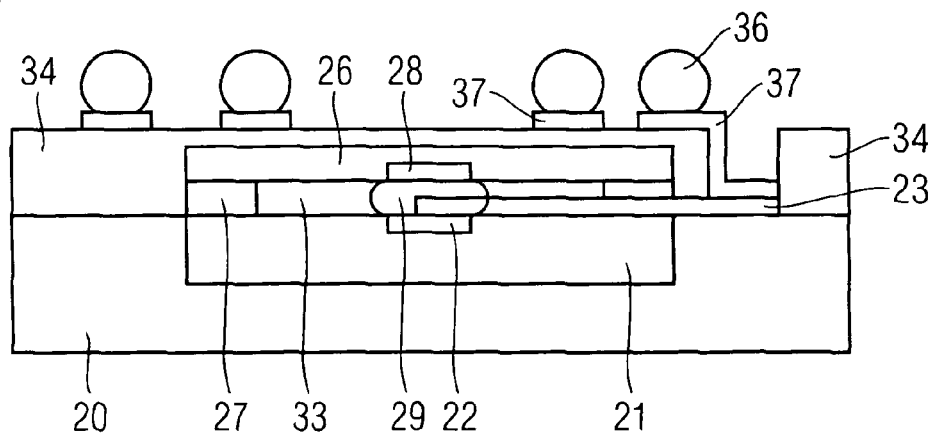

In order to achieve mechanical stability of the semiconductor apparatus, the second semiconductor component is embedded in a substrate 34. This substrate may correspond to the potting compound 20. Embedding also makes it possible to fill the cavities 33 between the two semiconductor components. A region 35 at the edge of the rewirings is not covered by the substrate 34. This can be achieved by subsequently removing the substrate or by previously applying a mask and finally removing this mask after the substrate 34 has been applied. The region 35 which is not covered by the substrate 34 is advantageously situated in the vicinity of the edge of the substrate 20. The external contact-connection regions 36 are thus at a distance from one another, said distance enabling simple installation on a printed circuit board. FIG. 6 shows that a short rewiring 37 which contact-connects the contact-connection regions 36 situated on a surface of the substrate 34 is deposited onto the region of the rewiring 23 which has not been covered. To this end, the rewiring 37 is patterned.

The rewiring 37 can be deposited using thin-film and/or thick-film technology, for example electrodeposition and/or deposition in a plasma reaction chamber.

Figure 7:
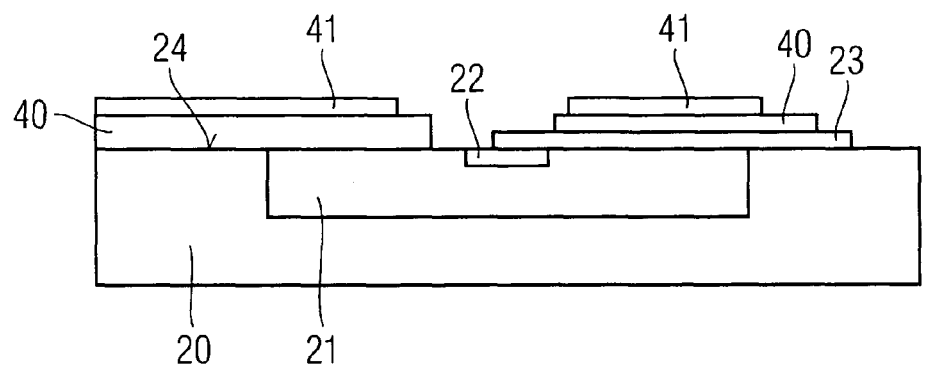
FIGS. 7 and 8 show diagrammatic illustrations of a second embodiment of the production method and an impedance-matched semiconductor apparatus.
Figure 8:
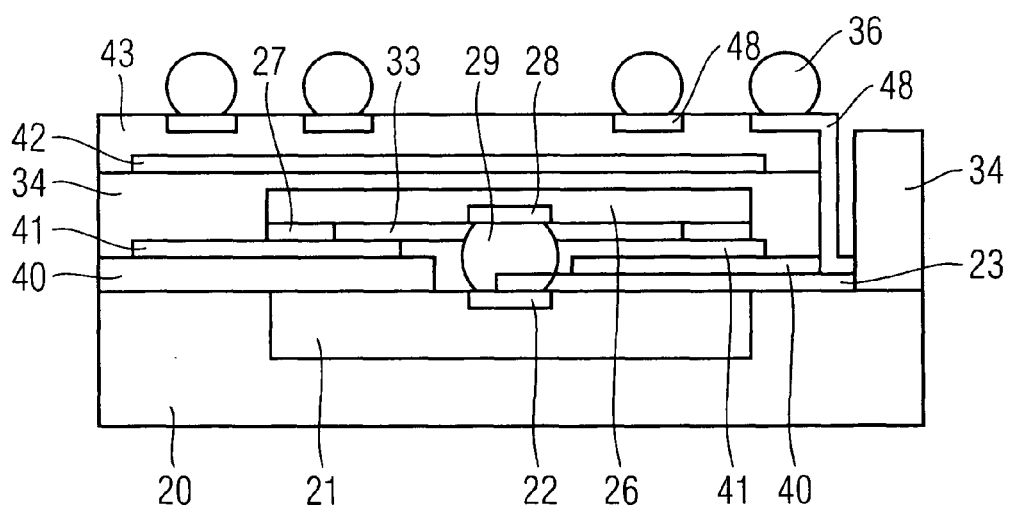

A diagrammatic illustration of a second embodiment of the present invention is described in FIG. 7. After a first semiconductor component 21 has been embedded in the potting compound 20 and a rewiring 23 has been formed, a dielectric layer 40 is deposited. The dielectric layer 40 is configured in such a manner that it does not cover an external region of the rewiring 23 in the region of the potting compound 20. A conductive layer 41 is deposited onto the dielectric layer. This conductive layer 41 then forms an equipotential surface or an earth surface. In the case of a given electric constant of the dielectric 40 and the typical frequencies of the semiconductor component, the thickness of the dielectric layer 40 and the width of the wiring 23 are selected, in accordance with known techniques or knowledge of electrodynamics, in such a manner that it is possible to match the impedance in an optimum manner.

In subsequent steps, as described in the first exemplary embodiment, a second semiconductor component is fastened using adhesive elevations on the second semiconductor component or on the dielectric layer. The two contact-connection regions 22 and 28 are electrically connected in turn using a contact-connection device 29. A substrate 34 is then applied in order to encapsulate the second semiconductor component. A conductive layer 42, typically comprising a metal, is deposited onto the substrate 34, said layer constituting an equipotential or earth surface. A dielectric 43 is deposited onto the conductive earth surface 42. In the final steps, a rewiring 48 is effected, said rewiring connecting the rewiring 23 to the external contact-connection regions situated on an uppermost surface of the dielectric layer 43. The impedance of the second rewiring 48 is matched using the second earth surface 42 and the dielectric layer 43 lying in between. The advantage of this embodiment resides in the fact that impedance matching is essentially ensured from the external contact connection 36 to the branch in the rewiring 23 in the immediate vicinity of the contact-connection regions 22 and 28.

Figure 9:
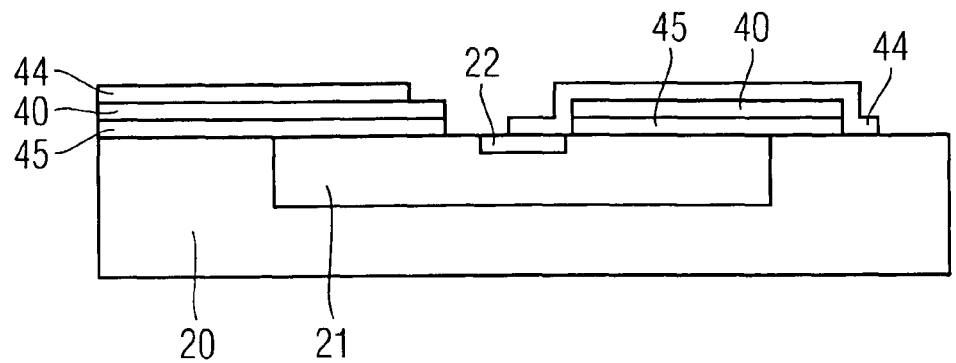
FIGS. 9 and 10 show a diagrammatic illustration of a third embodiment of the production method and an impedance-matched semiconductor apparatus.
Figure 10:
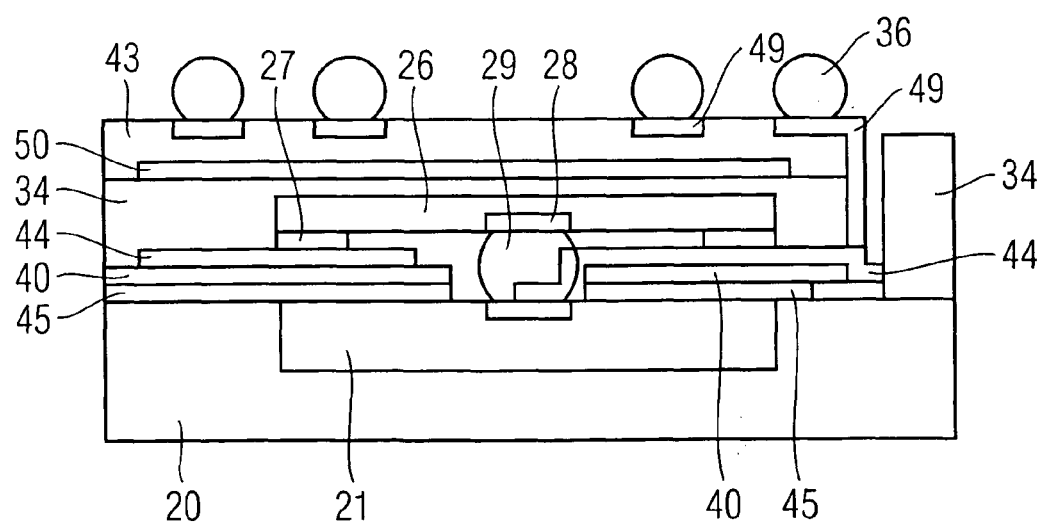
Figure 11:
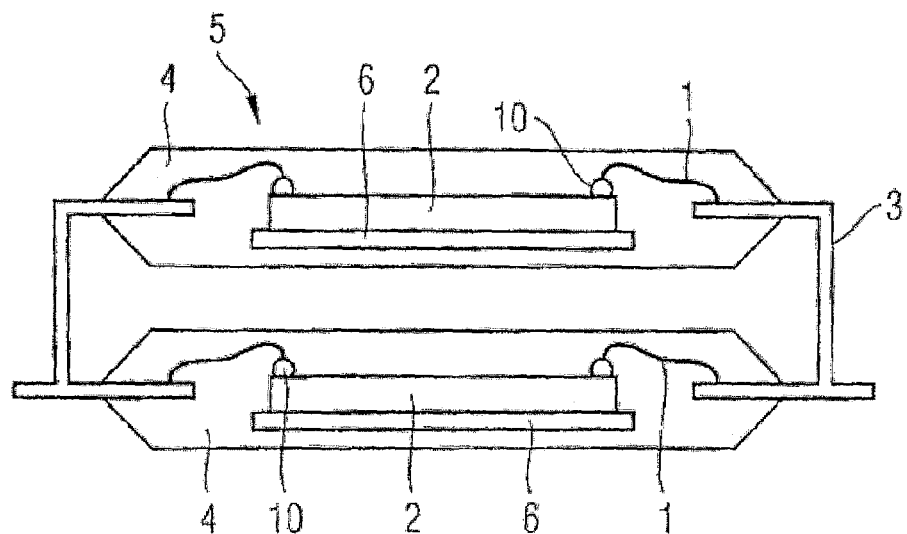
FIGS. 11-14 show diagrammatic illustrations of stacked semiconductor component apparatuses according to the prior art.
Figure 12:
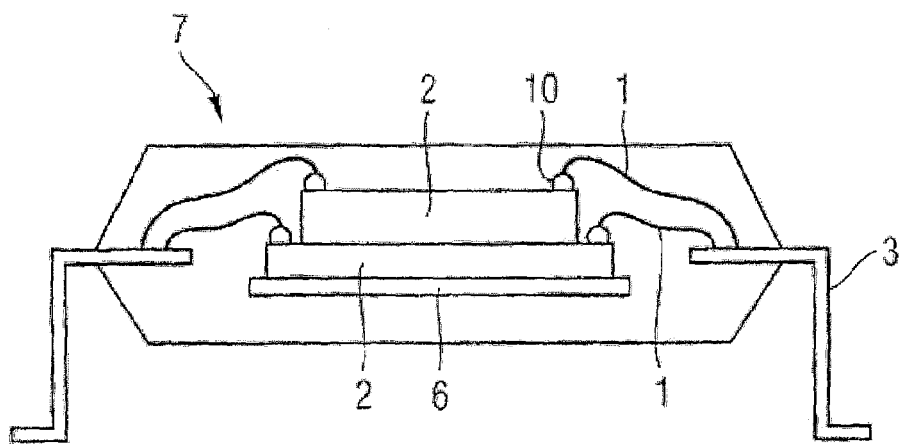
Figure 13:
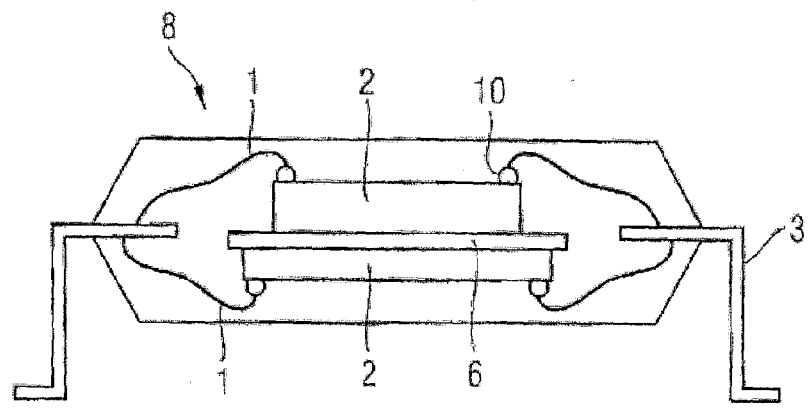
Figure 14:
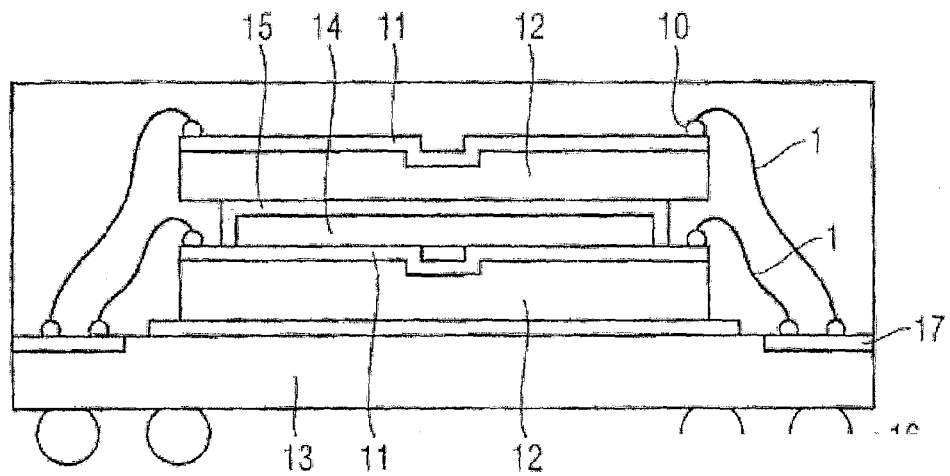

FIGS. 9 and 10 illustrate a third embodiment of the present invention. This embodiment differs from the second embodiment by virtue of the fact that an equipotential or earth surface 45 is applied to the first embedded semiconductor component 21 in a first step. This earth surface 45 does not touch the contact-connection region 22. A dielectric layer 40 is deposited onto the earth surface 45. A rewiring 44 is then formed. This rewiring contact-connects the contact-connection region 22. The impedance of this rewiring is matched using the earth surface 45 and the dielectric layer 40. The subsequent steps for producing the third embodiment of the present invention correspond to those of the second embodiment.

Although the present invention was described with reference to preferred exemplary embodiments, it is not restricted thereto. In particular, various techniques are known in order to fasten the second semiconductor component on the first semiconductor component. Furthermore, the materials for the rewiring are not restricted to metals but may likewise comprise doped semiconductor materials.

LIST OF REFERENCE SYMBOLS

1 Internal wiring
2 Unhoused semiconductor component
3 External contact-connection region
4 Housing
5 Semiconductor component
6 Carrier substrate 7, 8 Semiconductor apparatus having stacked semiconductor components
10 Contact region of 2
11 Covering layer
12 Semiconductor component
13 Interposer with internal wiring
14 Spacing
15 Insulation
16 External contact
17 Contact-connection region
18 First substrate or potting compound
19 First semiconductor component
20 First contact region of 21
23, 44 First rewiring
24 Surface of 20
25 First active side of 21
26 Second semiconductor component
27 Adhesive elevation
28 Second contact region of 26
29 Contact-connection device
30 Second active side of 26
31 Second inactive side of 26
33 Cavities
34 Second substrate
35 Contact-connection opening
36 External contact
37, 48, 49 Second rewiring
40, 43 Dielectric layer
41, 42, 45, 50 Earth surface

What is claimed is:

1. Semiconductor apparatus, comprising:
stacked semiconductor components with:
a first semiconductor component with a first contact region, and
a second semiconductor component with a second contact region being arranged in such a manner that the first contact region and the second contact region are opposite one another, wherein the first semiconductor component is embedded in a first potting compound and the second semiconductor component is embedded in a second potting compound, and
a contact-connection device conductively connecting the first contact region to the second contact region, and the contact-connection device being connected to an external contact-connection region on an outer surface of the second potting compound by means of a first rewiring and a second rewiring, the first rewiring being situated directly between the two contact regions and the second rewiring contact-connecting the external contact-connection region and contact-connecting a region of the first rewiring not covered by the second potting compound, provision being made of at least one earth surface that runs parallel to the rewiring, and
a dielectric layer being introduced between the rewiring and the earth surface in order to match the impedance of the rewiring.

2. Semiconductor apparatus according to claim 1, the first potting compound or the second potting compound containing a polymer.

3. Semiconductor apparatus according to claim 1, the contact-connection device having conductive adhesive and/or solder deposits and/or being produced using diffusion soldering.

* * * * *